United States Patent
Gong et al.

[19]

[11] Patent Number: 6,011,501
[45] Date of Patent: Jan. 4, 2000

[54] CIRCUITS, SYSTEMS AND METHODS FOR PROCESSING DATA IN A ONE-BIT FORMAT

[75] Inventors: Xue-Mei Gong; John James Paulos; Mark Alexander; Eric Gaalaas; Dylan Hester, all of Austin, Tex.

[73] Assignee: Cirrus Logic, Inc.

[21] Appl. No.: 09/224,389

[22] Filed: Dec. 31, 1998

[51] Int. Cl.[7] .................................................. H03M 1/66
[52] U.S. Cl. .............................................................. 341/150
[58] Field of Search ..................................... 341/150, 144, 341/126, 152, 153

[56] References Cited

U.S. PATENT DOCUMENTS 5,008,674  4/1991  Da Franca et al. ..................... 341/150
5,012,245  4/1991  Scott et al. ............................. 341/150

*Primary Examiner*—Brian Young
*Attorney, Agent, or Firm*—James J. Murphy, Esq.; J.P. Violette, Esq.; Peter Rutkowski, Esq.

[57] ABSTRACT

Digital-to-analog conversion circuitry 100 is shown including a path for processing data in a 1-bit format. First portion of an analog finite impulse response filter 300 includes pre-selected number of delay elements 301 for receiving stream of data in the 1-bit format and outputting a plurality of signals in response. A switched capacitor digital-to-analog converter 106 forms a second portion of the finite impulse response filter 301 and has a plurality of elements each receiving one of the plurality of signals as selected to effectuate a set of filter coefficients, converter 106 summing the plurality of signals and outputting an analog data stream.

22 Claims, 6 Drawing Sheets

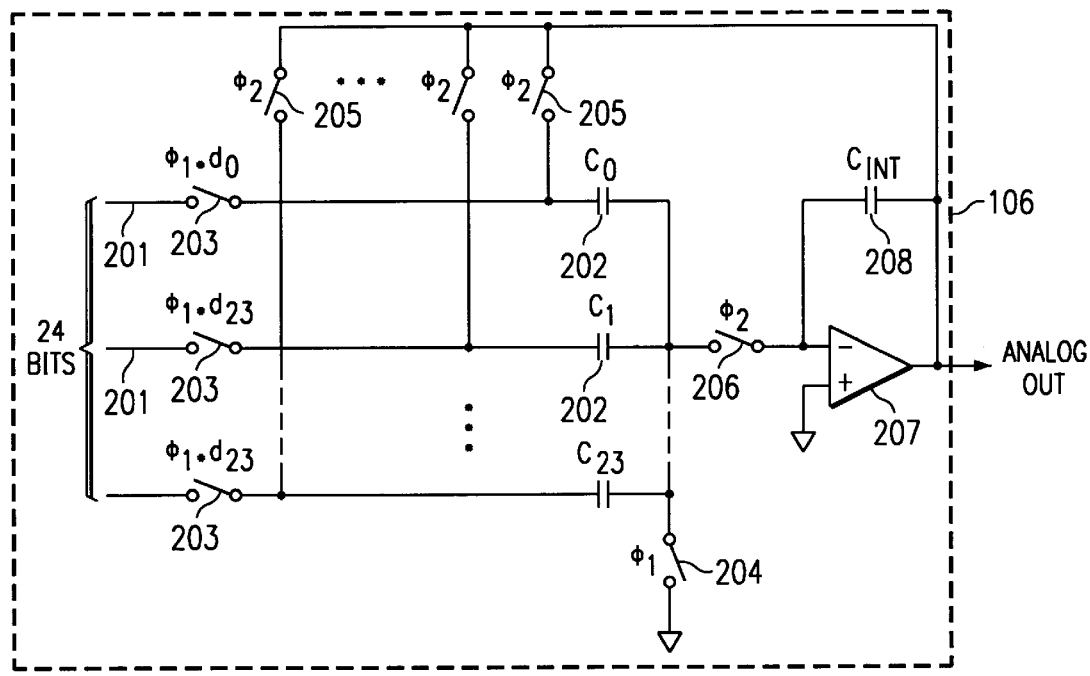
FIG. 2
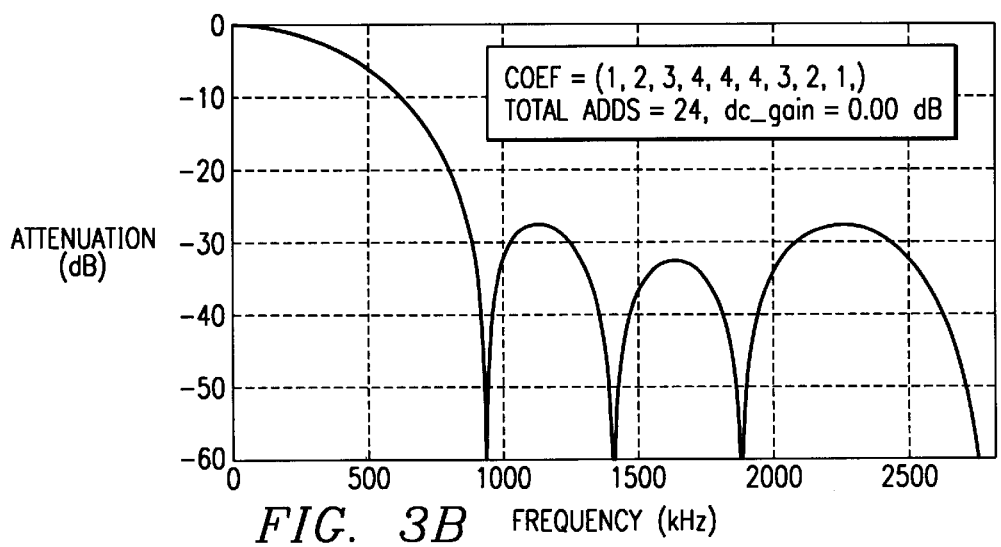
FIG. 3B  FREQUENCY (kHz)

CIRCUITS, SYSTEMS AND METHODS FOR PROCESSING DATA IN A ONE-BIT FORMAT

CROSS-REFERENCE TO RELATED APPLICATION

The following co-pending and co-assigned application contains related information and is hereby incorporated by reference: Ser. No. 09/253,427 (Attorney Docket No. 0910-CE (P073US)), entitled "REFERENCE VOLTAGE CIRCUITRY FOR USE IN SWITCHED-CAPACITOR APPLICATIONS", by inventor Jason Powell Rhode, filed Dec. 31, 1998.

BACKGROUND OF THE INVENTION

1. Field of the Invention

The present invention relates in general to data processing and in particular to circuits, systems and methods for processing data in a one-bit format,

2. Description of the Related Art

Current digital audio systems record data on a compact disk (CD), digital audio tape (DAT) or digital video disk (DVD) in a 24-bit format. During playback, this 24-bit data is typically passed through a 24-bit interpolation filter which smooths the incoming digital samples and increases the data sample rate. A delta-sigma modulator then reduces the number of bits representing each sample, for example from 24-bit samples to 5-bit samples. In doing so, the delta-sigma modulator creates significant quantization noise; however, the delta-sigma modulator has the ability to shift this self-generated noise out of the signal band.

The 5-bit data from the delta-sigma modulator is next thermometer encoded to represent 24 levels. The thermometer encoded data is passed through dynamic element matching logic implementing an algorithm for shaping the noise to account for digital to analog converter (DAC) element mismatch. The DAC which ultimately converts the digital data to analog for eventual presentation to the listener as audio is typically a switched-capacitor circuit that also provides filtering.

The new Sony/Philips 1-bit recording system ("Super Audio CD") stores data from an analog modulator onto the given digital storage media in a 1-bit format. As a result, techniques for converting data in the 1-bit digital format to analog must be developed. This is a non-trivial problem since such factors as filtering out of band noise, gain control through the modulator, and hardware minimization must be considered. Moreover, it is usually a requirement that a dynamic range of –120 dB in the audio band be achieved. The trend has been to use multi-bit DACs to achieve this type of dynamic range, however this compounds the problem of adapting to the 1-bit format.

Given the potential for wide acceptance use of the Sony/Philips 1-bit audio format, and the continuous demand for improved sound quality, circuits, systems and methods for digital to analog conversion of 1-bit audio data are required.

SUMMARY OF THE INVENTION

According to the principles of the present invention, a digital-to-analog conversion circuitry is provided including a path for processing data in a 1-bit format. A first portion of an analog finite impulse response filter includes a preselected number of delay elements for receiving stream of data in the 1-bit format and outputs plurality of signals in response. A switched capacitor digital-to-analog converter forms a second portion of finite impulse response filter and has a plurality of elements each receiving one of the plurality of signals selected to effectuate a set of filter coefficients, the converter summing the plurality of signals and outputting an analog data stream.

The principles of the present invention allow for the implementation of circuits, systems and methods which have substantial advantages over the existing art Among other things, these principles will allow for the construction and use of multi-bit DACs when 1-bit audio format data is being processed. The circuits, systems and methods embodying the present principles require little additional hardware in the digital domain and still allow for processing of multi-bit data with the multi-bit DAC in the traditional manner. Moreover, the analog circuitry remains exactly the same whether the input data is in a multi-bit or single-bit format.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a diagram showing the switched capacitor / filter of FIG. 1 in further detail;

FIGS. 3B and 3C are diagrams describing the frequency response of the filter of FIG. 3A at unity gain;

DESCRIPTION OF THE PREFERRED EMBODIMENTS

Figure 1:
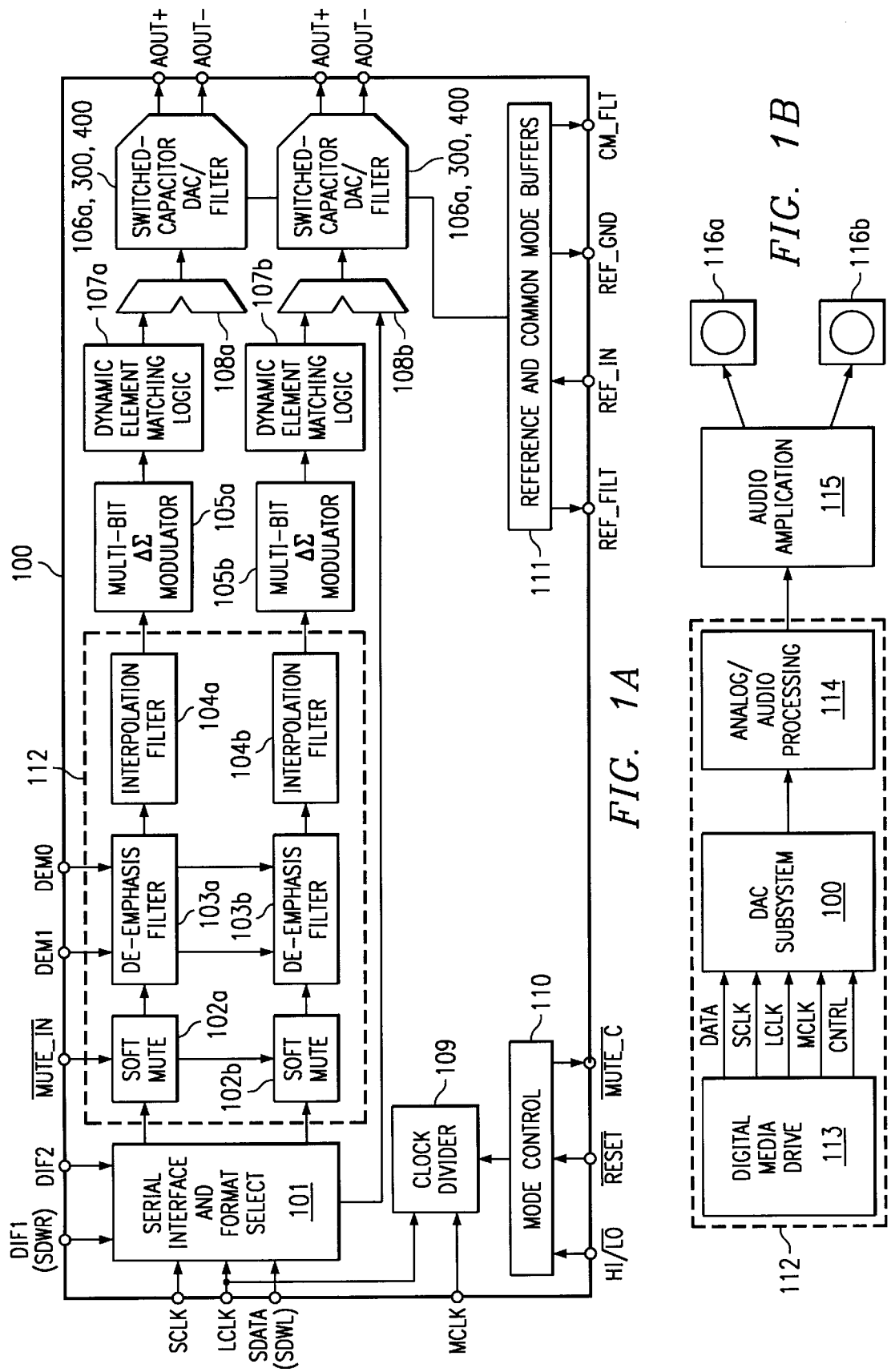
FIG. 1A is a diagram illustrating the major functional blocks of a digital to audio converter (DAC) subsystem embodying the present inventive concepts.
FIG. 1B is a diagram illustrating the major functional blocks of a digital audio system utilizing the DAC subsystem of FIG. 1B.

FIG. 1A is a diagram of the major functional blocks of a digital to audio converter (DAC) 100 subsystem fabricated on a single integrated circuit chip and embodying the present inventive concepts. DAC subsystem 100 advantageously allows for processing of data in the Sony/Philips 1-bit format while maintaining compatibility with existing 24-bit audio systems.

Multi-bit digital audio data is received word-serial through the SDATA pin and serial interface/format selector 101 timed by the sampling clock (SCLK). The left and right channel data are alternately processed in response to the left-right clock (LRCK). This clock is normally at the same rate as the data input rate (i.e., the sampling rate) Control signals DF1 and DF0 allow for the selection of the input format, for example, right or left justified, 20-bit or 24bit word width, to name a few possibilities. For discussion purposes, it will be assumed that when multibit data is being processed, the word-width is 24 bits. When 1-bit data is being input, the SDATA port receives left channel data and the DF1 port right channel data.

For multi-bit formats, each channel of received data is passed through soft mute circuitry 102a or 102b, which provides for software controlled muting, and then through a de-emphasis filter 103a or 103b. De-emphasis filter 103 is controlled by signals DEM1 and DEM2, and when required, performs de-emphasis of data sampled at either 32, 44.1 or 48 kHz. In the illustrated embodiment, the data for each of the left and right channels are respectively input to interpolation filters 104a and 104b. For a 96 kHz sampling clock, interpolation filter 104 increases the data frequency by a factor of 8 and for a 48 kHz sampling clock by a factor of 16. In the preferred embodiment, soft mute circuitry 102, de-emphasis filters 103 and interpolation filters 104 are integrated into a single integrated circuit block 112.

Multi-bit modulators 105a and 105b reduce the number of bits per word output from interpolation filters 104a and 104b respectively. For example, when 24-bit data are being operated on, the number of bits per word may be reduced to five (5) Modulators 105 also shape their self-generated quantization noise. In the illustrated embodiment, modulators 105 are delta-sigma modulators with 64/128× oversampling.

The data is then thermometer encoded, for example to twenty-five (25) data levels (–12, –11, . . . 0, 1, 2, . . . 12). Before being fed to switched capacitor DACs / filters 106, the data from modulators 105 are passed through dynamic element matching (DEM) logic 107 which implements an algorithm for shaping noise in the output due to element mismatching in the DAC. DAC/filter 106 will be discussed further below Clock divider 109 derives the clocks necessary to drive the circuit blocks of DAC subsystem 100 from a received master clock (MCLK). The master clock could be operating at a rate of 512×48 kHz, for example. Mode control circuitry 110 allows for the selection of the sampling rate, reset of the chip and analog muting. In particular, the Hi/Lo pin when set to a 0 selects a sampling rate of 32 kHz, 44.2 kHz or 48 kHz while a logic 1 at this pin selects a 96 kHz sampling rate. Reset is initiated through the /RESET pin. The /MUTE_C allows the user to enable the muting function in the separate analog circuitry following DAC subsystem 100.

Circuit block 111 represents the reference and common mode buffers. The REF_FLT pin is used to connect chip 100 to a large external capacitor (not shown) for filtering one of the various reference voltages required on-chip. The capacitor is specifically connected between the REF_FLT pin and the REF_GND pin. The REF_IN pin is used to input a reference voltage (typically no higher than the analog power supply voltage VDDA) used to drive the switched-capacitor circuitry reference voltage inputs during the first part of the sampling process. The voltage at the REF_FLT pin (a filtered version of the voltage at the REF_IN pin) is used to complete the sampling. For a complete description of the process, please refer to co-pending and co-assigned application Ser. No. 09/272,493 (Attorney Docket No. 0910-CE (P073US), incorporated above.

FIG. 1B is a diagram of a typical system application of DAC subsystem 100. In this example, DAC subsystem 100 forms part of an entertainment component 112, such as a compact disk (CD) player, digital audio tape (DAT) player or digital video disk (DVD) unit. A digital media drive 113 recovers the digital data, for example 1-bit audio data in the Sony/Philips 1-bit format from the given digital data storage media, and passes that data, along with clocks and control signals, to DAC subsystem 100. It should be recognized that data, clocks and control signals sent to DAC subsystem 100 also may be operated on or generated by an audio controller or similar device. DAC subsystem 100 converts the data as described herein and sends it on to the analog/processing circuitry 114. The analog processing block 114 may for example, perform filtering, amplification, mixing and effects implementation. Analog data output from entertainment components 112 can then be amplified, if required, and output as audible tones by speakers 116.

FIG. 2 is a diagram showing switched capacitor/filter 106 in further detail. As shown in this figure, DAC/filter 106 is preferably a Sooch buffer as known in the art. Data from DEM logic 107 is passed through 24 corresponding data paths (elements) 201. There are two phases PHI1 ($\phi_1$) and PHI2 ($\phi_2$) with each phase comprising one-half a modulator clock period. During phase PHI1, the DEM output ($d_0$ to $d_{23}$) data is sampled onto capacitors 202, each of which is controlled independently and can hold either positive or negative unit charge. For example, when DEM data $d_i$ equals 1, capacitor $C_i$ connects to a positive reference voltage and when $d_i$ equals $\phi_1$, capacitor $C_i$ connects to a negative reference voltage. Preferably, capacitors 202 are all of equal value. During phase PHI2, the charge from capacitors 202 is passed by switches 205 and switch 206, summed by op-amp 207 and shared with the existing charge on integrator capacitor $C_{INT}$ 208. This results in low pass filtering where the ratio of $C_{INT}$ to $C_{TOTAL}$ ($C_{TOTAL}=C_1+ \ldots +C_{24}$) determines the pole. The higher the ratio, the lower the pole location and the better the noise filtering. Notwithstanding, a higher ratio consumes more chip area, since $C_{TOTAL}$ is constrained by the KT/C noise requirements. The analog output is passed on for analog processing.

There a several ways that conversion of the 1-bit data could possibly be implemented. One way would be to input the 1-bit data directly to modulators 105 and on to DAC/filters 106. This technique suffers from at least two major problems. First, near-out-of-band noise in the 1-bit data stream will pass through as signal. One of the primary advantages of using multibit modulators is that their out-of-band noise is much smaller than in single-bit modulators and as a result, less chip area is needed for analog post-filtering circuitry. This advantage is lost with a 1-bit data stream and since more post-conversion analog filtering is required. Second, because a 1-bit data stream includes a large noise component, a gain reduction must be applied at the modulator stage to avoid overload. Consequently, a significant gain boost is necessary in the later stages of the analog processing circuitry for compensation, which in turn further increases overall system noise and cost.

Another possible way to implement 1-bit digital to analog data conversion is to send the data stream directly to the input of multibit DAC 106. In other words, the 1-bit data controls all of the DAC elements connecting them either to +VREF or –VREF. One problem with this technique is that all of the out-of-band noise in the 1-bit data stream is passed through the DAC. Additionally, a significant slew rate must be supported by the DAC op-amp.

Finally, it is possible to filter out the quantization noise from the 1-bit data stream before its introduction to the multibit modulator. This technique requires a substantial amount of hardware since the filter must operate at a very high clock rate, as dictated by the 64× or 128× oversampled bitstream.

According to the inventive concepts, 1-bit data received through serial interface/format selector 101 bypass interpolation filters 104, modulators 105, and DEM logic 107. Instead, the 1-bit data for each channel is switched by multiplexer 108 to a set of digital delay elements to the Sooch buffer discussed above, which acts as the filter summer. In 1-bit applications, the interpolation filters, modulators and DEM logic can be shut-down to save power. It should be noted that advantageously, the digital delay elements can be implemented through the reuse of delay elements in either DEM logic 107, interpolation filters 104 or modulators 105. Preferably, delay elements in DEM logic 107 are reused.

Figure 3A:
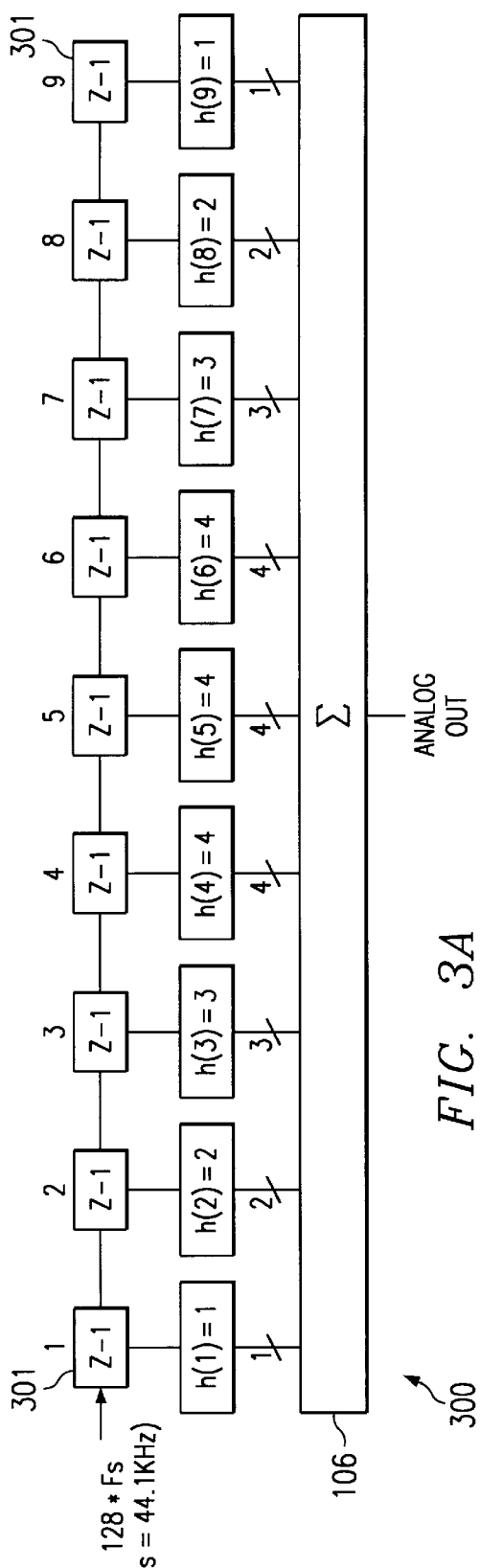
FIG. 3A is a diagram illustrating a first filter configuration according to the present concepts.
Figure 3C:
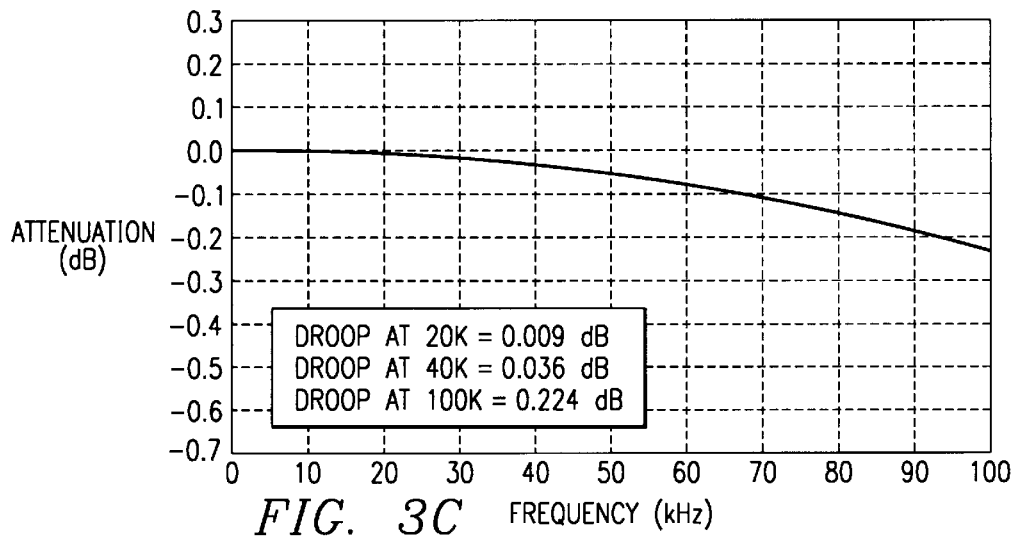
Figure 3D:
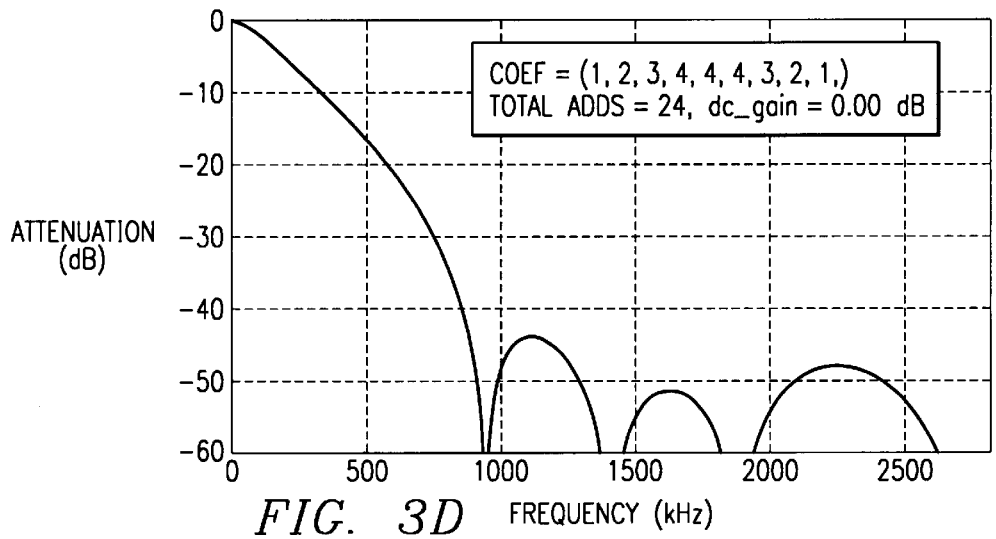
FIGS. 3D and 3E are diagrams illustrating the frequency response of the filter of FIG. 3A when operating with a multibit switched-capacitor filter.
Figure 3E:
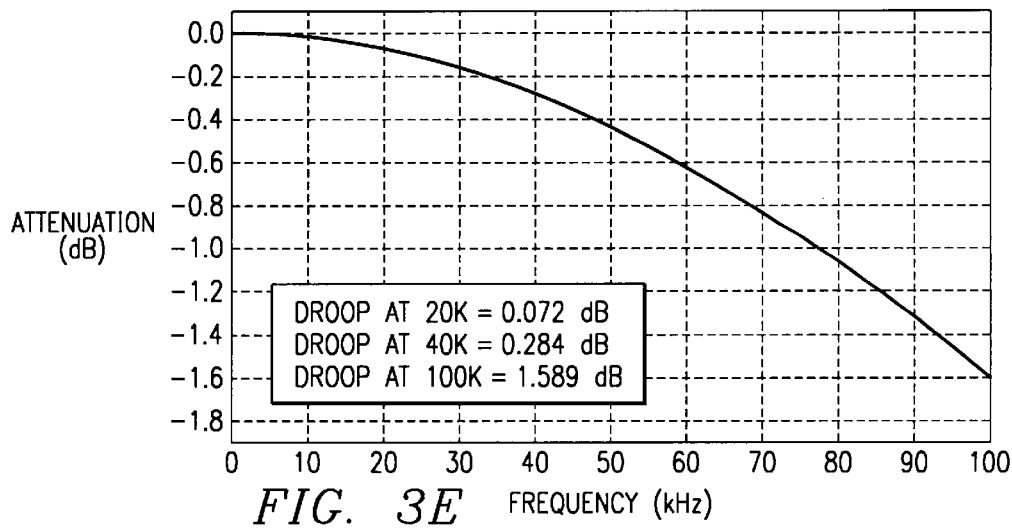

FIG. 3A is a diagram of a first digital to analog converter/filter 300 configuration according to the present concepts. In this case, no passband droop compensation is provided for all other filters in the path. Therefore, the digital filter passband droop must be minimized, although this trades off near-out-of-band noise filtering. The embodiment of FIG. 3A uses nine (9) delay elements 301 and a weighing coefficient sequence of (1,2,3,4,4,4,3,2,1). In other words, the outputs of delay elements 301 are sent to the 24-bit inputs of DAC/filter 106, with those elements associated with a coefficient 4 coupled to 4 inputs to DAC/filter 106, those with a coefficient of 3 to 3 inputs, and so on. The frequency response of digital filter 300 with unity gain (i.e., no integration capacitor $C_{INT}$ 208 is being used) is shown in FIGS. 3B and 3C and the frequency response of digital filter 300 operating as a switched-capacitor filter having a pole at 196 kHz (i.e., integration capacitor $C_{INT}$ 208 is being used in FIGS. 3D and 3E.

Digital filter 300 has the advantage that the dc-gain is approximately 0 dB, since all the filter coefficients are positive. The disadvantages of filter 300 are that the overall passband droop is not insignificantly small and the near-out-of-band filtering is not maximized. These advantages are overcome by the embodiment of the invention shown in FIG. 4A.

Figure 4A:
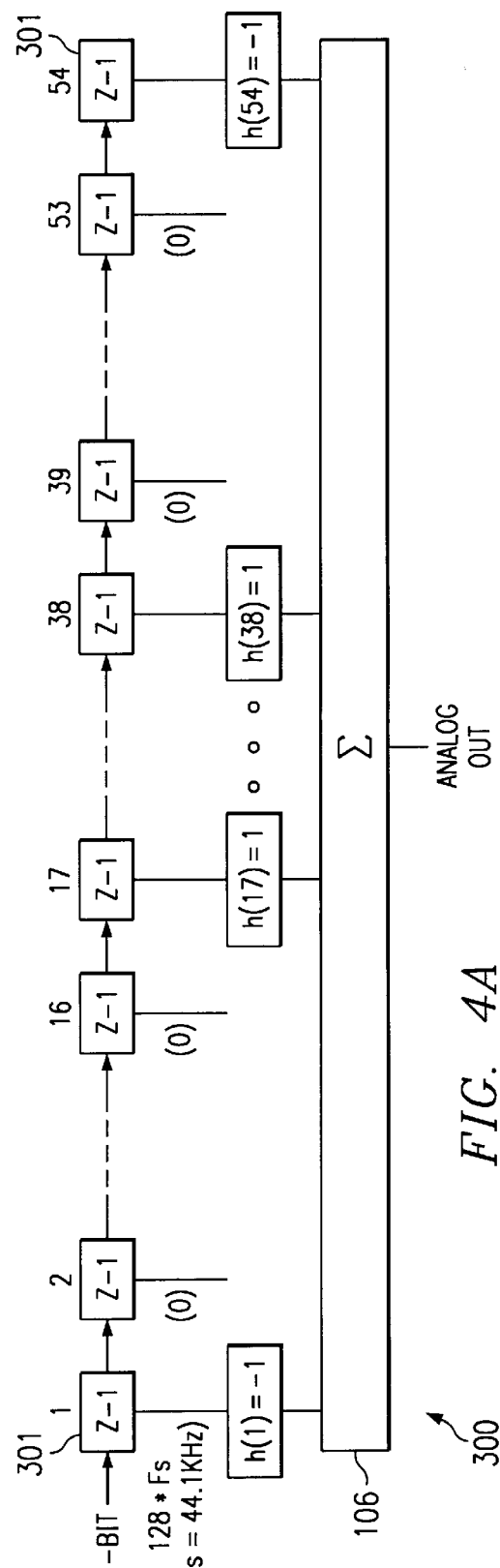
FIG. 4A is a diagram illustrating a second filter which uses both positive and negative coefficients according to the present concepts.

In FIG. 4A, a digital filter 400 is depicted having fifty four (54) delay elements and which uses both positive and negative coefficients. The sequence of weighing coefficients is (−1, 15-0's, 22-1's, 15-0's,−1). Those nodes that have a 0 coefficient are not connected to DAC/filter 106; the remaining 24 nodes (having coefficients of 1 or −1) are each coupled to one of the 24-bit input of DAC/filter 106. For a coefficient of −1, sampling capacitors 202 are coupled to a voltage $V_{REF}$ and for a coefficient of −1, to a voltage of −$V_{REF}$.

The two negative coefficients create peaks in the frequency response close to the passband edge for compensating for all other filters in the path. In addition, by using negative coefficients, the first zero in the digital filter can be placed as close as possible to the passband edge to improve near-out-of-band filtering. In other words, the negative coefficients compensate for the passband droop which would normally would result by placing the first zero close to the passband edge. A slight drawback of using the negative coefficients is that it produces a gain not of 0 dB, but of −1.58 dB (20 log 10(20/24)). It may or may not be necessary to compensate for this small loss in later analog stages, depending on the application.

Figure 4B:
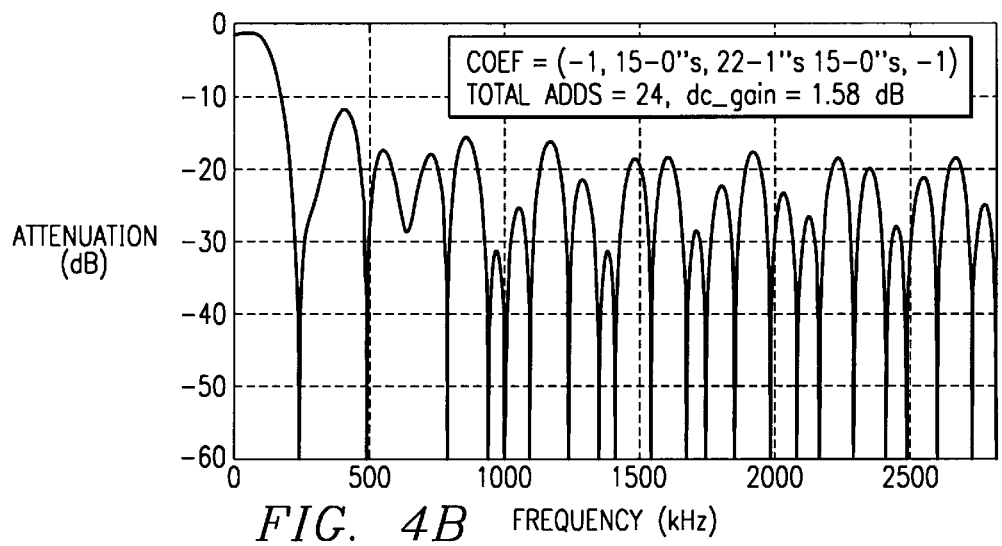
FIGS. 4B and 4C depict the frequency response of the filter of FIG. 4A at unity gain.
Figure 4C:
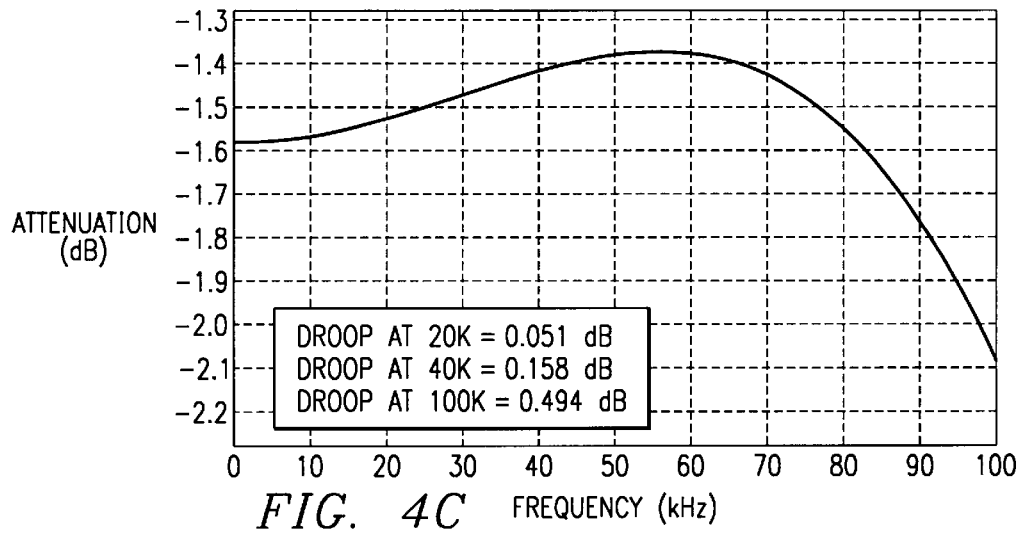
Figure 4D:
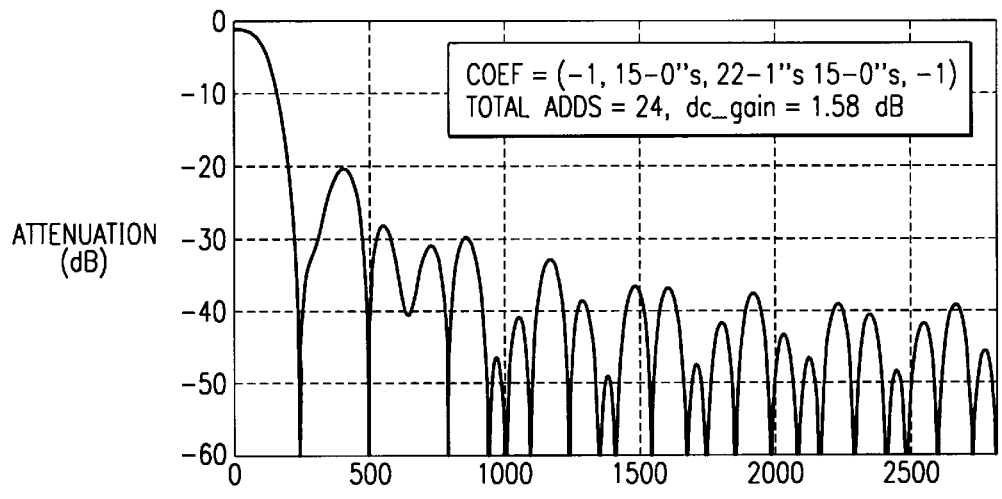
FIGS. 4D and 4E depict the frequency response of the filter of FIG. 4A operating together with a multi-bit switched-capacitor filter.
Figure 4E:
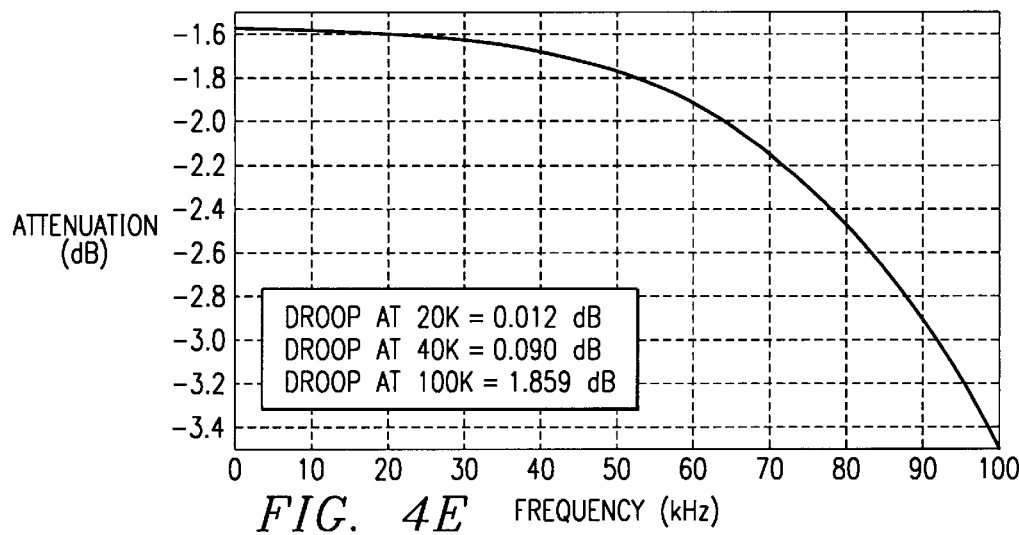

FIG. 4B depicts the frequency response of filter 400 with unity gain (no capacitor $C_{INT}$), with FIG. 4C depicting the frequency response of filter 400 when DAC/filter 106 when capacitor $C_{INT}$ 208 is being used. In this case, digital filter 400 is compensating for the passband droop of a 1st order switched-capacitor filter with a pole located around 196 kHz.

Figure 5A:
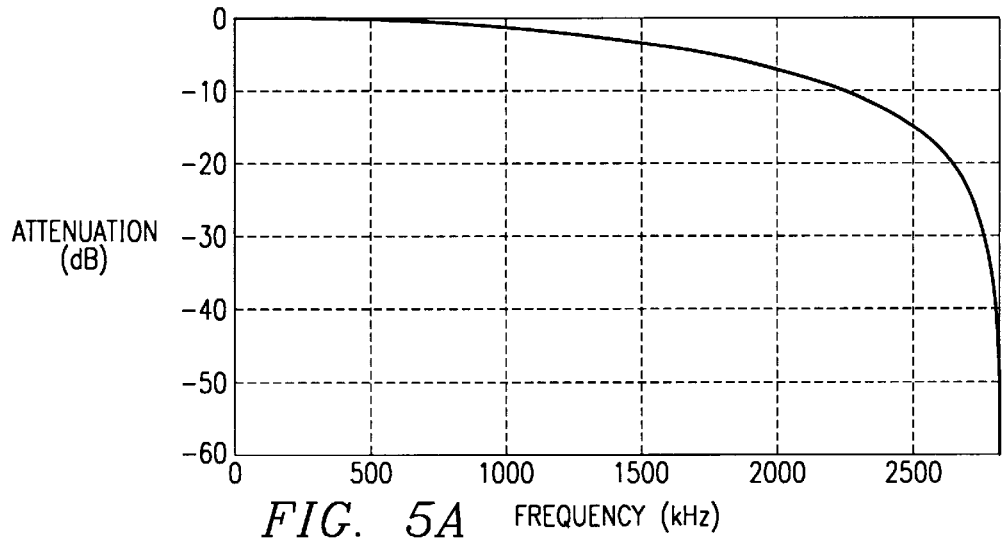
FIGS. 5A and 5B depict the frequency response of the filter of FIG. 4A for a 64 Fs input rate to the filter delay lines using double sampling of 1-bit data
Figure 5B:
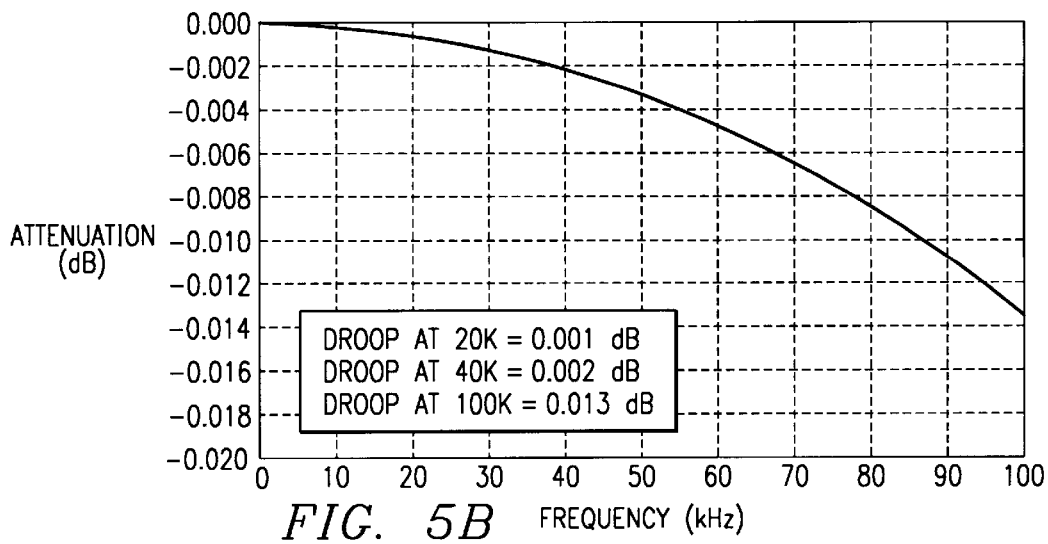

In the preferred embodiments described in FIGS. 3 and 4, data are input to the delay lines always at a frequency 128 Fs, where Fs =44.1 kHz. However, subsystem 100 can support 1-bit DSD data at either the 128 Fs or the 64 Fs rate into the delay lines. For the 64 Fs case, each channel of 1-bit DSD data is double sampled, which results in interpolating the input data rate by a factor of 2 with hold functionality. This two-time hold does not significantly affect droop at the pass band edge, yet helps reduce 64 Fs image and out of band noise. An example is shown in FIG. 5.

One advantage of always sampling the input DSD data at the 128 Fs rate is in the management of digital noise for the benefit of the analog circuitry, since, typically, switched capacitor DACs 106 will also be sampling at the 128 Fs rate. Moreover, by sampling at the 128 Fs rate, the "SCLK" rate is also 128 Fs. The SCLK can also be a significant noise source as noise is coupled into the analog circuitry through the bondwires, lead frame, etc. This is especially true if the SCLK rate is half the analog sampling rate. However, when the SCLK rate is the same as the analog sampling rate, the noise coupled into the analog circuitry can only result in a dc offset which can easily be accounted for.

In sum, the principles of the present invention provide for the support of 1-bit digital to analog conversion in a multibit DAC. Advantageously, these principles require little hardware for their implementation and still allow for the processing of multibit data in the traditional manner.

Although the present invention and its advantages have been described in detail, it should be understood that various changes, substitutions and alterations can be made herein without departing from the spirit and scope of the invention as defined by the appended claims.

What is claimed is:

1. Digital to analog conversion circuitry comprising a path for processing data in a 1-bit format comprising:
   a first portion of a finite impulse response filter comprising a preselected number of delay elements for receiving a stream of data in the 1-bit format and outputting a plurality of signals in response; and
   a switched capacitor digital to analog converter forming a second portion of the finite impulse response filter having a plurality of elements each receiving a one of the plurality of signals selected as a function of a set of filter coefficients, said converter summing the plurality of signals and outputting an analog data stream.

2. The digital to analog conversion circuitry of claim 1 wherein the set of filter coefficients is selected to provide droop compensation for filters in a data path including the digital to analog conversion circuitry.

3. The digital to analog conversion circuit of claim 1 wherein the switched-capacitor converter comprises a Sooch buffer.

4. The digital to analog conversion circuitry of claim 1 wherein at least one of the set of coefficients is negative.

5. The digital to analog conversion circuitry of claim 1 wherein an output of at least one of the delay elements is coupled to a plurality of the elements of the switched-capacitor converter.

6. The digital to analog conversion circuitry of claim 1 wherein the set of coefficients is selected such that a dc gain of the finite impulse response filter is approximately 0 dB.

7. The digital to analog conversion circuitry of claim 1 wherein the set of coefficients is selected to minimize near-out-of-band noise.

8. The digital to analog conversion circuitry of claim 1 wherein the data comprises 1-bit digital audio data.

9. A single chip digital to analog conversion subsystem comprising:

an interface for receiving digital audio data in a 1-bit format; and a finite impulse response filter including a plurality of delay elements for delaying the 1-bit audio data by a preselected amount and a switched-capacitor DAC/filter for summing data from a plurality of outputs of said delay elements selected to effectuate a set of filter coefficients to generate a filtered analog signal, said DAC/filter having a a pole at a preselected frequency to minimize near-out-of-band noise.

10. The subsystem of claim 9 wherein at least some of said coefficients are preselected to generate peaking frequencies close to a selected passband edge of said filtered analog signal.

11. The subsystem of claim 9 wherein at least some of said coefficients are preselected to locate a filter zero near a selected passband edge of said filtered analog signal.

12. The subsystem of claim 9 and further comprising circuitry for processing multibit PCM audio data received by said interface.

13. The subsystem of claim 12 wherein said circuitry for processing multi-bit words of audio data comprises:

an interpolation filter for increasing a data rate of said multi-bit data;

a modulator for reducing a number of bits in said multi-bit words of audio data received from said interpolation filter;

dynamic element matching logic receiving said audio data from said modulator for shaping output noise; and a multiplexer for selectively coupling said data output from said matching logic with said switched-capacitor DAC/filter.

14. The subsystem of claim 9 wherein said switched-capacitor DAC/filter comprises:

a plurality of sampling capacitors;

a first plurality of switches for sampling data received from said delay elements onto said sampling capacitors during a first timing phase; and a second plurality of switches for transferring said data from said sampling capacitors to a summing node of an operational amplifier during a second timing phase.

15. A digital audio processing system comprising:

a source of a stream of 1-bit format digital audio data; and a converter for converting the 1-bit format digital audio data received from said source of audio data into an analog format comprising a finite impulse response filter operating in response to a preselected set of filter coefficients for filtering said stream of data in the 1-bit format and outputting a filtered analog data stream in response.

16. The system of claim 15 wherein said source of said stream comprises a compact disk player.

17. The system of claim 15 wherein said source of said stream comprises a digital audio tape player.

18. The system of claim 15 wherein said source of said stream comprises a digital video disk player.

19. A method for processing 1-bit format digital audio data using a multibit DAC, the method comprising the steps of:

passing the stream of digital data through a plurality of delay elements; and summing selected output in accordance with a set of filter coefficients of the delay elements using a switched capacitor multibit DAC and generating audio data in an analog format in response.

20. The method of claim 19 and further comprising the step of selecting at least one of the coefficients to be negative to locate peaking frequencies close to a desired passband of the data in the analog format.

21. The method of claim 19 wherein a number of the plurality of delay elements is greater than a number of inputs to the switched capacitor circuit.

22. The method of claim 19 wherein the delay elements comprise a part of a finite impulse response filter and the switched capacitor circuitry comprises a Sooch buffer.

* * * * *